United States Patent
Suto (10) Patent No.: US 6,582,240 B2
(45) Date of Patent: Jun. 24, 2003

(54) CONNECTOR JACK ATTACHING STRUCTURE AND ELECTRONIC CAMERA

(75) Inventor: Kazutoshi Suto, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/941,741

(22) Filed: Aug. 30, 2001

(65) Prior Publication Data

US 2002/0025697 A1 Feb. 28, 2002

(30) Foreign Application Priority Data

Aug. 31, 2000 (JP) ........................................ 2000-264114

(51) Int. Cl.[7] .................................................. H01R 9/09
(52) U.S. Cl. .......................................... 439/79; 439/95
(58) Field of Search ................................. 439/607, 609, 439/95, 79

(56) References Cited

U.S. PATENT DOCUMENTS

| | | | | |
|---|---|---|---|---|
| 4,628,410 A | * | 12/1986 | Goodman et al. | 361/789 |
| 5,533,908 A | * | 7/1996 | Henry et al. | 439/329 |
| 5,755,595 A | * | 5/1998 | Davis et al. | 439/607 |
| 5,993,258 A | * | 11/1999 | Matsunuma et al. | 439/607 |
| 6,050,853 A | * | 4/2000 | Ando et al. | 439/571 |
| 6,062,893 A | * | 5/2000 | Miskin et al. | 439/374 |
| 6,276,943 B1 | * | 8/2001 | Boutros et al. | 439/676 |

* cited by examiner

Primary Examiner—Lynn D. Feild
Assistant Examiner—Phuong Dinh
(74) Attorney, Agent, or Firm—Sughrue Mion, PLLC (57) ABSTRACT

A connector jack surface-mounted on a board is reinforced, thereby enhancing durability against insertion and extraction and prying of a plug, and reducing noise. A reinforcing member is shaped to cover an outer circumference of a UBS connector and has attaching potions to be attached to a control board, the attaching portion is fixed to the control board with a screw and the attaching portion is fixed with an engaging portion of the attaching portion which is engaged with a protruding portion of the control board. Accordingly, the USB connector surface-mounted on the control board by soldering is reinforced by the reinforcing member which covers the outer circumference of the USB connector and is fixed to the control board.

10 Claims, 7 Drawing Sheets

CONNECTOR JACK ATTACHING STRUCTURE AND ELECTRONIC CAMERA

BACKGROUND OF THE INVENTION

1. Field of the Invention

The present invention relates to a connector jack attaching structure and an electronic camera, and more specifically a structure for reinforcing a connector jack to be surface-mounted on a board.

2. Description of the Related Art

As methods for attaching a connector jack to a board, there have conventionally been adopted a method to solder a connector jack to a surface of a board, a method to insert a connector jack partially into a through hole of a board and solder the connector jack from a rear side of the board, a method to screw a connector jack to a board and the like.

Furthermore, a liquid crystal monitor which is disposed in an electronic camera is fixed to a metal frame and the metal frame is fixed in the electronic camera together with a board or the like having a connector jack.

In case of a small connector jack, there is adopted a method which solders the connector jack to a surface of a board, but this method poses a problem that the method relies on strength of a pattern on the board and the connector jack becomes susceptible to detachment after a plug is repeatedly inserted and extracted and pried, though the method requires a smaller number of attaching steps as compared with other attaching methods. A small connector jack which is disposed on a small appliance such as an electronic camera in particular has a small soldering area and is problematic in its durability.

In case of an electronic camera in which a connector jack and a liquid crystal monitor are disposed at locations close to each other, there is a problem that the connector jack and the liquid crystal monitor produce influences on each other due to noise and another problem that the metal frame for holding the liquid crystal monitor is configured to have a form for fitting the liquid crystal monitor, thereby having a complicated form and a heavy weight.

SUMMARY OF THE INVENTION

The present invention has been attained in view of such circumstances and has an object to provide a connector jack attaching structure which reinforces a connector jack to be surface-mounted on a board and is capable of enhancing durability of the connector jack against insertion and extraction and prying of a plug.

Furthermore, the present invention has another object to provide an electronic camera comprising a connector jack and a liquid crystal monitor disposed at locations close to each other, which is capable of lowering noise, and can be configured compact and light in weight.

In order to attain the above-described objects, the present invention is directed to a connector jack attaching structure for attaching a connector jack to a board, comprising: a reinforcing member shaped to cover an outer circumference of the connector jack and having an attaching portion to be attached to the board, wherein: the connector jack is surface-mounted on the board; the outer circumference of the connector jack surface-mounted on the board is covered with the reinforcing member; and the attaching portion of the reinforcing member is fixed to the board.

That is, the connector jack surface-mounted on the board is reinforced by covering the outer circumference of the connector jack with the reinforcing member which is separate from the connector jack and fixing the reinforcing member to the board. Since the reinforcing member covers the circumference of the connector jack, the reinforcing member serves for preventing noise from penetrating into the connector jack.

The above-described connector jack is characterized in that it has a rectangular pipe member into which an external connector is to be inserted, that a surface of the above-described pipe member is placed on the above-described board and surface-mounted thereon by soldering, and that the above-described reinforcing member is brought into contact with other three surfaces of the above-described pipe member. Furthermore, the attaching portion of the above-described reinforcing member is characterized in that it is fixed to the above-described board by at least one of screwing, soldering and engagement. The above-described reinforcing member is characterized in that it comprises a sheet metal member and the above-described sheet metal member is grounded.

The above-described reinforcing member is characterized in that it has a spring portion which protrudes on a side opposite to the above-described attaching portion and is formed integrally with the reinforcing member, and the above-described spring portion is kept in elastic contact with a member adjacent to the above-described board, thereby grounding the above-described member. Accordingly, the member adjacent to the above-described board can be grounded easily by utilizing the above-described reinforcing member.

The present invention is also directed to an electronic camera comprising the above-described connector jack attaching structure and a liquid crystal monitor, characterized in that the above-described liquid crystal monitor is held with a molded resin frame and a metal member on a rear surface of the above-described liquid crystal monitor is brought into elastic contact with the spring portion of the above-described reinforcing member at a fixing time of the above-described frame in the camera, thereby grounding the metal member on the rear surface of the above-described liquid crystal monitor by way of the above-described reinforcing member.

That is, when a frame for holding the liquid crystal monitor is configured as the molded resin frame, the frame can have a more complicated form and a lighter weight than a metal frame. Furthermore, the electronic camera is configured to reduce noise by grounding the metal member on the rear surface of the liquid crystal monitor easily by utilizing the above-described reinforcing member.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Now referring to the accompanying drawings, description will be made of preferable embodiments of the connector jack attaching structure and the electronic camera according to the present invention.

Figure 1:
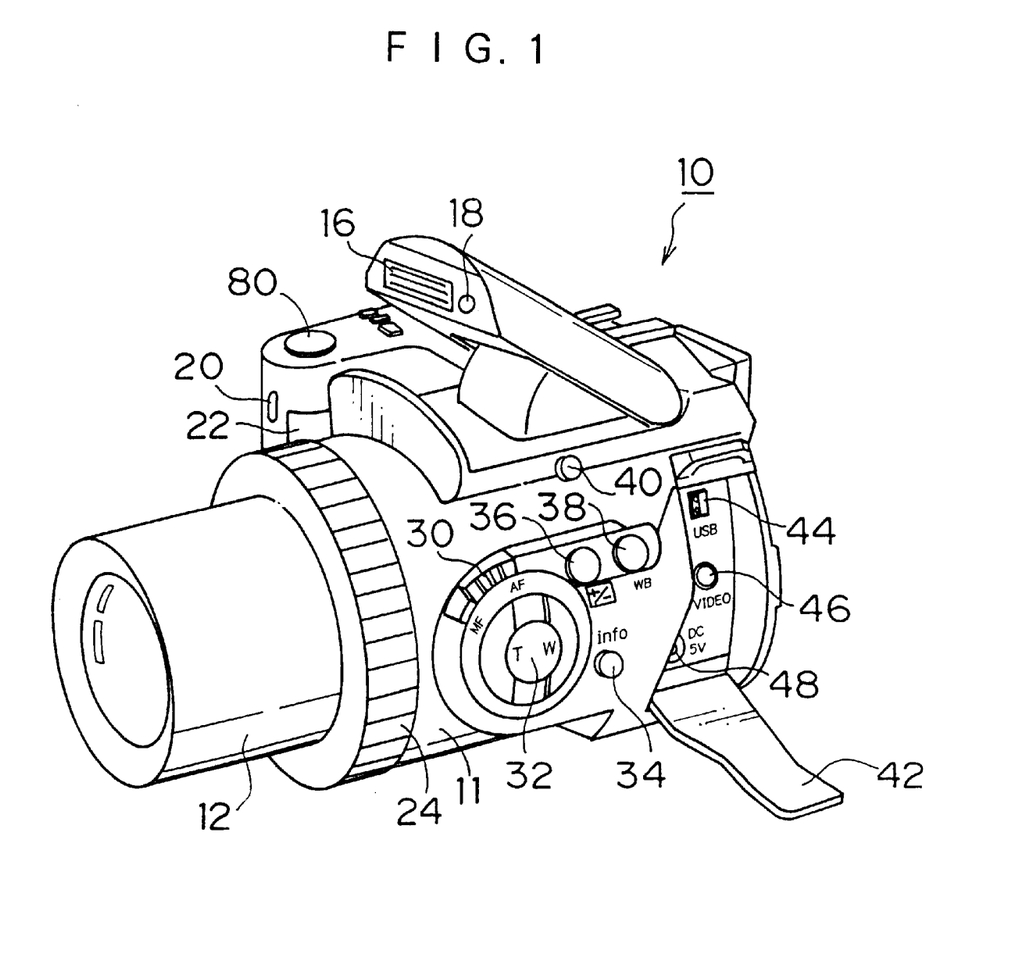
FIG. 1 is a perspective view of an electronic camera according to the present invention as seen from right front.
Figure 2:
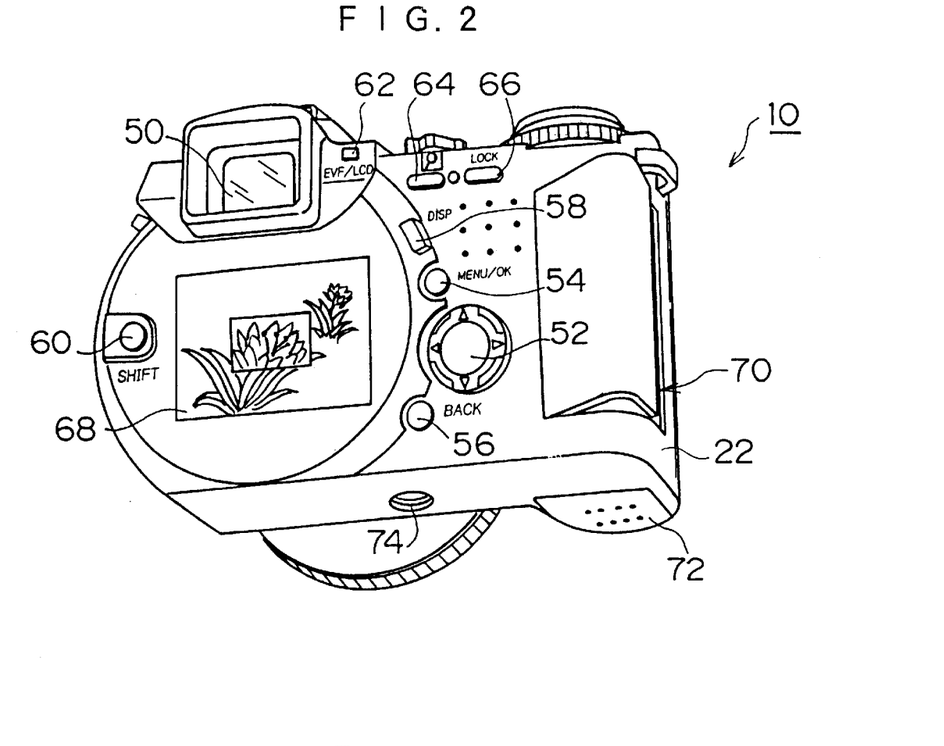
FIG. 2 is a perspective view of the electronic camera shown in FIG. 1 as seen from behind.
Figure 3:
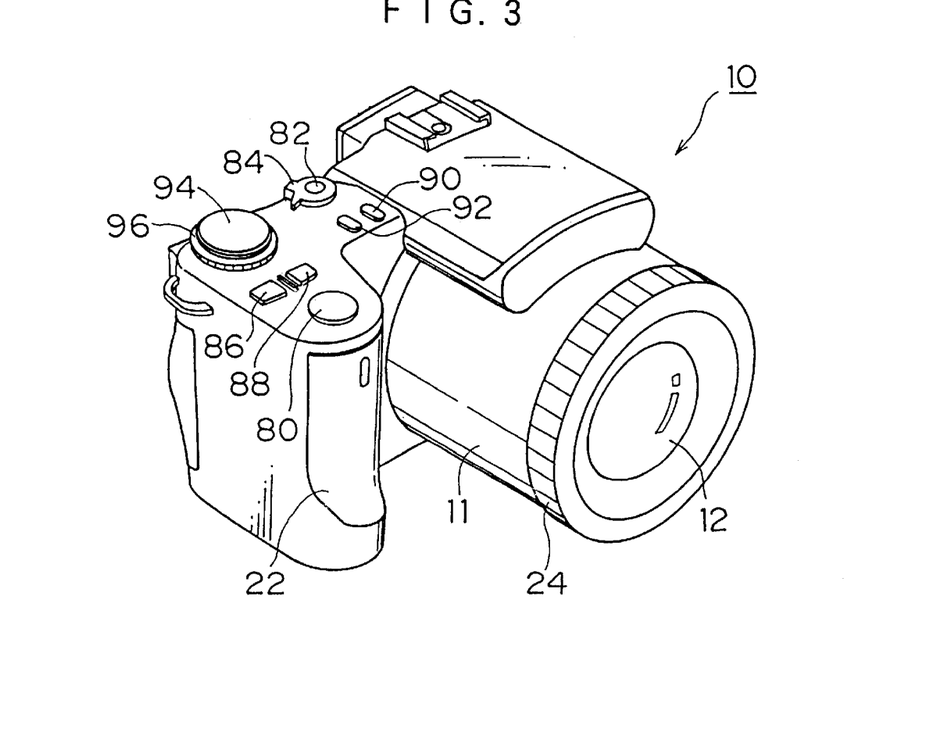
FIG. 3 is a perspective view of the electronic camera shown in FIG. 1 as seen from left front.

FIGS. 1, 2 and 3 are perspective views of the electronic camera according to the present invention as seen from right front, behind and left front respectively.

A cylindrical lens section 11 which protrudes frontward from a camera main body is attached to a front surface of an electronic camera 10 as shown in FIGS. 1 and 3. Disposed in this lens section 11 is a lens unit 12 having a lens barrel which can freely advance and retreat, and fitted over a tip portion of the lens section 11 is a manual focus ring 24 which is to be manipulated for manually adjusting a focused position.

Furthermore, disposed on the front surface of the electronic camera 10 are a pup-up type strobe 16 which irradiates an object with rays for compensating an amount of rays, a strobe light adjusting sensor 18 which adjusts an amount of rays emitted from the strobe 16 dependently on a distance to the object, a self timer lamp 20 and a grip section 22 which holds the electronic camera 10 accurately.

Disposed on a side surface of the electronic camera 10 are a focus mode selector switch 30 which selects a manual focus mode (MF mode) for focusing by manipulating the manual focus ring 24 or an autofocus mode (AF mode) for automatic focusing, a zoom switch 32 which indicates adjustments of a focal length and an angle of view to a wide side and a telephoto side, a cross key 52, an information button 34 for indicating, upon being clicked, a liquid crystal monitor 68 or a liquid crystal finder 50 of the electronic camera 10 which is to display photographing conditions at a photographing time, an exposure correction button 36 which indicates an exposure correction amount for a photographed image, a white balance adjusting button 38 which adjusts white balance of an image of the object, and a strobe pup-up button 40 which sets the strobe 16 at a location ready for use. Furthermore, disposed in an accessory cover 42 of the electronic camera 10 are a communication connector (USB connector) 44 for information communication with another electronic appliance, a video output terminal 46 for video signal communication and a connector jack (DC input terminal) 48 for power source input.

As shown in FIG. 2, disposed on a rear surface of the electronic camera 10 are a liquid crystal finder 50 which allows a user to confirm the image of the object by peeping even in a bright environment, the cross key 52 for inputting information into the electronic camera 10 by the user while indicating up, down, left and right directions, a menu/execute button 54 which is used to instruct setting of white balance, brightness and the like for photographing or reproduction, and recording photographing conditions for a photographed image as photographing conditions for a next photographing in recording means, a cancel/return button 56 which instructs a processing cancellation or processing return to a previous state, a display button 58 which instructs display on the liquid crystal monitor 68, and a shift button 60 which allocates another processing to a multi-function operating button.

Furthermore, disposed on the rear surface of the electronic camera 10 are a display selector button 62 for selecting the liquid crystal finder 50 or the liquid crystal monitor 68 which is to display an image or information, an enlargement switch 64 which instructs enlarged display for confirming a focused condition of the object, an AE lock button 66 which fixes a photometric value measured in a half-depressed condition of a shutter button 80 and the liquid crystal monitor 68. Disposed on a bottom surface of the electronic camera 10 are a battery cover 72 which serves as a cover for a portion in which a battery is to be accommodated and a hole 74 for a tripod.

The cross key 52 is capable of inputting instructions in four corresponding directions (right, left, up and down): a right key and a left key functioning as buttons for feeding frames in a normal direction and a reverse direction respectively, whereas an up key and a down key functioning as zoom levers for adjusting a zoom magnification in the photographing mode. The menu/execute button 54 is used for shifting a displayed usual screen to a menu screen in each mode or instructing settlement of selected contents, execution of a processing, confirmation of a processing and the like. Furthermore, a removable memory card (not shown) can be set in a slot cover 70 of the electronic camera 10.

As shown in FIG. 3, disposed on a top surface of the electronic camera 10 are a shutter button 80 for instructing photographing, a power source switch 82 for instructing an operation or no operation of the electronic camera 10, a mode setting switch 84 for setting the electronic camera 10 in the photographing mode or the reproduction mode, a strobe button 86 for instructing light emission or inhibition of light emission from the strobe, a macro button 88 for instructing macro photographing, a self timer button 90, a successive photographing button 92 for instructing setting or cancellation of successive photographing mode, a mode selector dial 94 for selecting various photographing modes of the electronic camera 10 and a command dial 96 for setting the various photographing modes.

Figure 4:
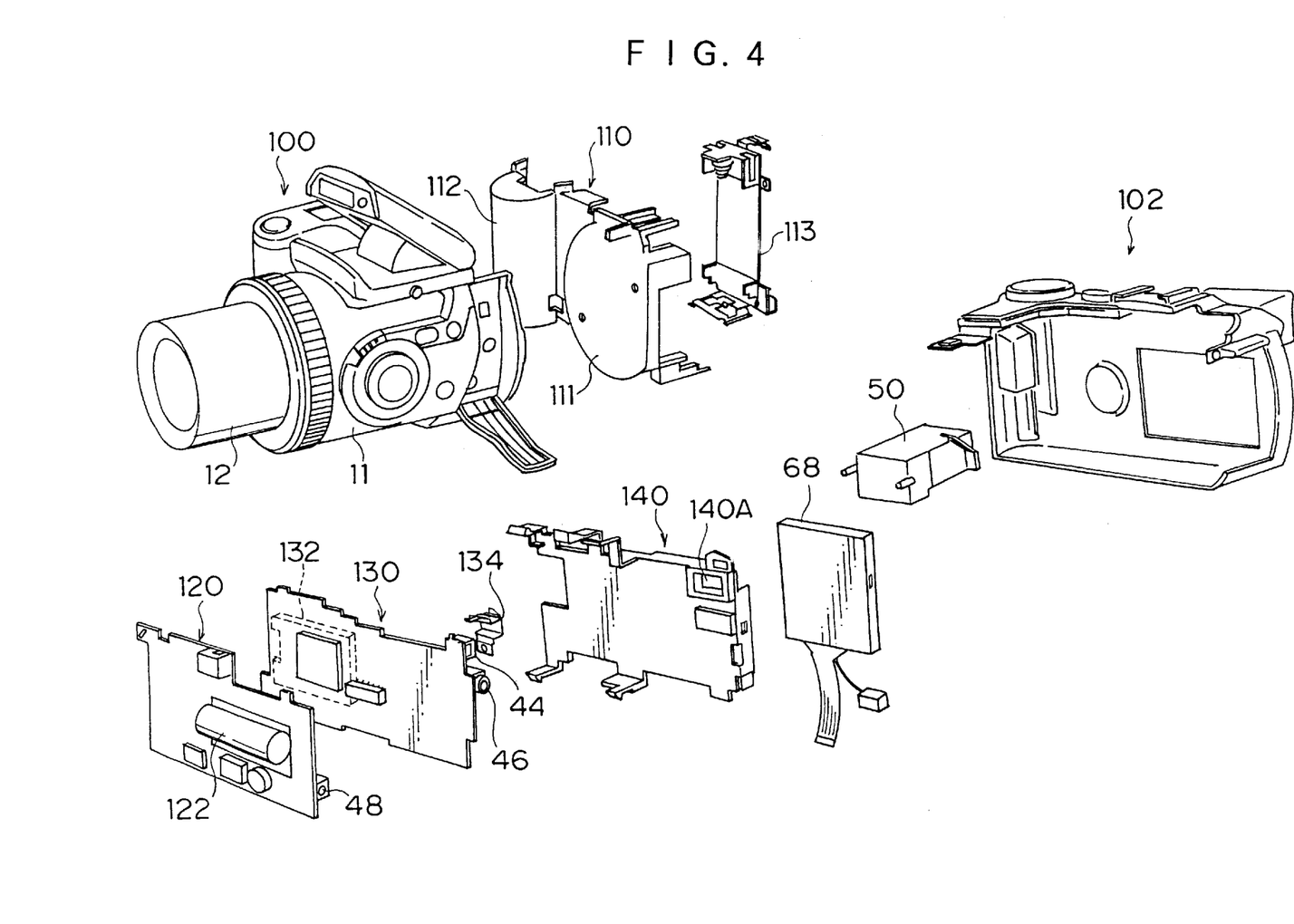
FIG. 4 is an exploded perspective view of the electronic camera according to the present invention.

FIG. 4 is an exploded perspective view of the above-described electronic camera 10.

As shown in FIG. 4, the electronic camera 10 comprises a sheath body (a front cabinet 100 and a rear cabinet 102), a lens unit 12, a main frame 110, a power source board 120, a control board 130, a sub-frame 140 and a liquid crystal monitor 68.

Figure 5:
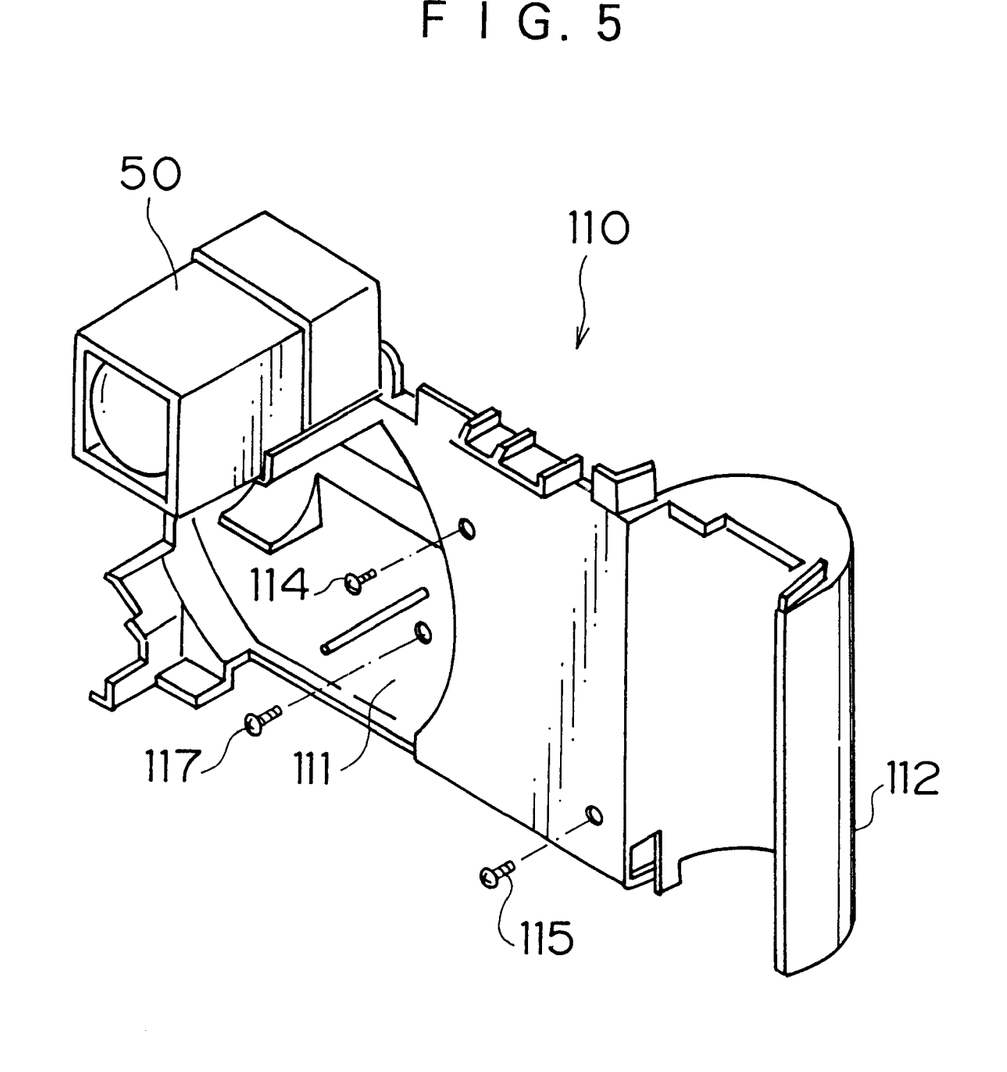
FIG. 5 is a perspective view of a main frame as seen from a rear side.

The front cabinet 100 has not only a cylindrical lens section 11 which protrudes frontward but also a grip section 22 which protrudes frontward (see FIG. 3). The main frame 110 is a resin molding which is made of resin such as ABS resin, and comprises a lens mounting portion 111 protruding toward the lens section 11 and a battery chamber 112 protruding along the grip section 22 which are molded integrally. To be attached to this battery chamber 112 is a sheet metal member 113 for battery disposed on which are a terminal section for connection to battery terminals and a member for attaching a battery cover. The above-described main frame 110 is fixed to the front cabinet 100 with screws 114 and 115 as shown in FIG. 5.

Figure 6:
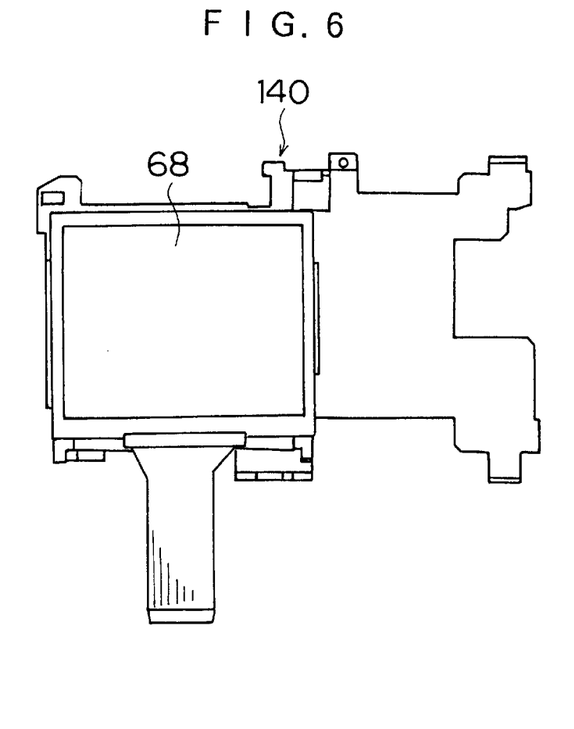
FIG. 6 is a plan view of a sub-frame holding a liquid crystal monitor.

Furthermore, the liquid crystal monitor 68 is held on the sub-frame 140 as shown in FIGS. 4 and 6. Like the main frame 110, the sub-frame 140 is a resin molding which is made of the ABS resin or the like.

Mounted on a power source board 120 are a DC input terminal 48, a main capacitor 122 for a strobe 16 and the like, and mounted on a control board 130 are a USB connector 44, a video output terminal 46, a card connector 132 into and out of which a memory card is to be inserted and removed, and the like.

Figure 7:
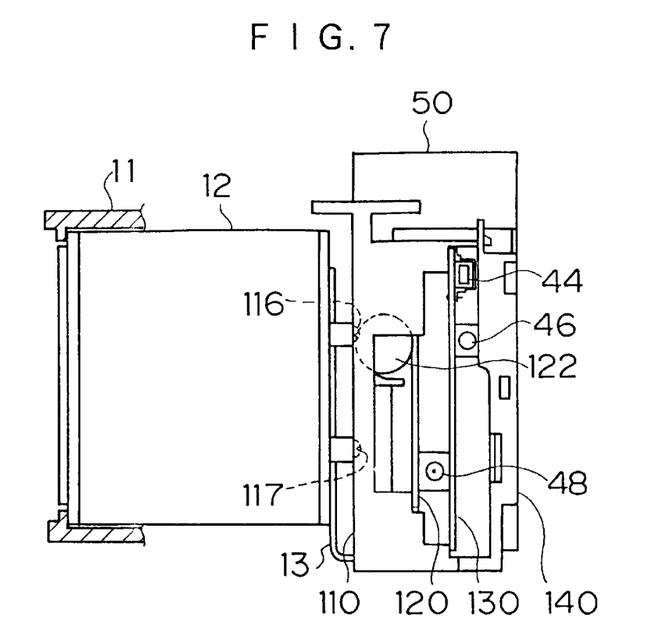
FIG. 7 is a side view of main members showing an internal configuration of the electronic camera.

FIG. 7 is a side view of main members showing an internal configuration of the electronic camera 10.

As shown in FIG. 7, the lens unit 12 is accommodated in the lens section 11 (lens accommodator) of the front cabinet 100, and a rear portion of the lens unit 12 is fixed to the lens mounting portion 111 of the main frame 110 (see FIGS. 4 and 5) with screws 116 and 117. In other words, the lens unit 12 is fixed between a tip portion of the lens section 11 and the main frame 110. Built in the lens unit 12 are a motor for driving a zoom lens, a focusing lens, etc., a lens position detecting sensor and the like, which are connected electrically to the control board 130 by way of a flexible wiring pattern 13.

Furthermore, the power source board 120 and the control board 130 are sandwiched and fixed between the main frame 110 to which the sheet metal member 113 for battery is attached and the sub-frame 140. In other words, the lens unit 12, the power source board 120 and the control board 130 are fixed to the main frame 110 respectively with the main frame 110 interposed.

In the configuration of the electronic camera which is assembled as described above, the lens unit 12, the power source board 120 and the control board 130 are fixed to the above-described main frame 110 respectively with the main frame 110 interposed, thereby making it possible to configure the electronic camera 10 compact in a horizontal direction. The power source board 120 and the control board 130 have small notches to avoid a liquid crystal finder 50 but have no large notch to avoid the lens unit 12, thereby making it possible to configure the boards 120 and 130 to have shapes closer to rectangles which permit an efficient pattern wiring. Furthermore, a main capacitor 122 is disposed right after the lens unit 12 with the main frame 110 interposed and at a location close to the strobe 16 located on a top of the lens section 11, thereby making it possible to obtain a high energy efficiency and ensure a long creepage distance of the main capacitor 122 owing to the main frame 110 made of resin. Furthermore, the maim frame 110 and the sub-frame 140 which are made of the resin make it possible to lessen a weight of the camera.

Figure 8:
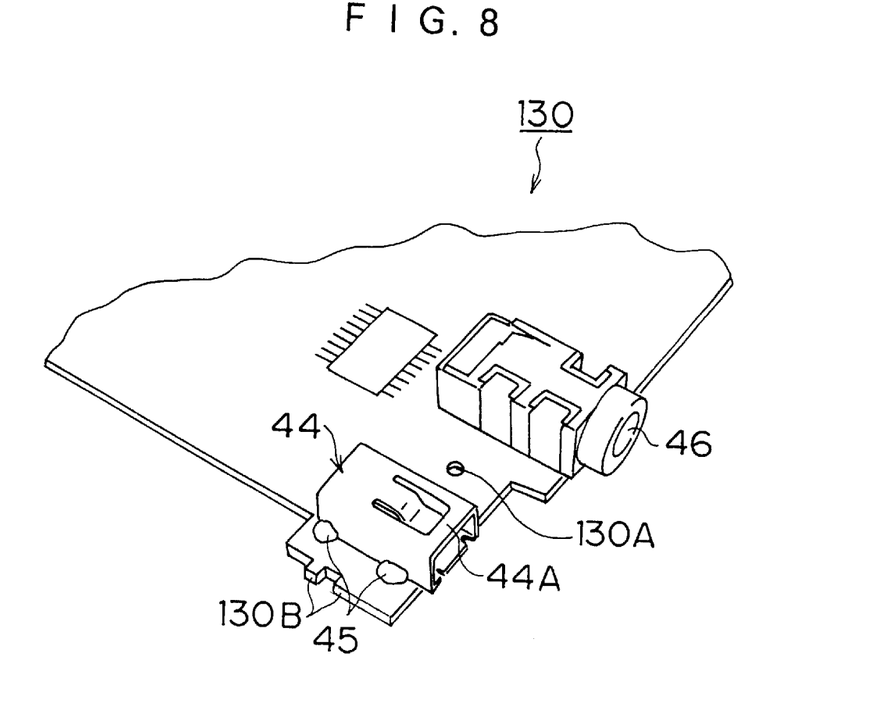
FIG. 8 is an enlarged perspective view of main members of a control board.

FIG. 8 is an enlarged perspective view of main members of the control board 130.

As shown in FIG. 8, the USB connector 44 and the video output terminal 46 are mounted on the control board 130. The video output terminal 46 has a member (contact member) which is fixed to the above-described video output terminal 46, inserted into a through hole of the control board 130 and soldered from a rear side of the control board 130. Accordingly, the video output terminal 46 is fixed so as to be highly durable of connection, disconnection and wrenching of a plug.

On the other hand, the USB connector 44 has a rectangular pipe member 44A into which the USB plug is to be inserted, and a bottom surface of the pipe member 44A is disposed on the control board 130 and surface-mounted on a pattern such as ground of the control board 130 by soldering 45. Accordingly, the USB connector 44 in this condition relies on strength of the pattern and may come off the control board 130 after a plug is repeatedly inserted and extracted and pried.

Figure 9:
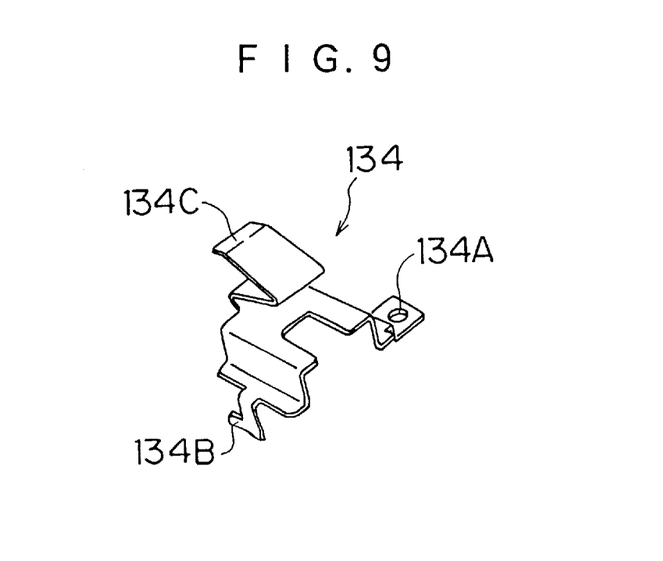
FIG. 9 is a perspective view of a reinforcing member for reinforcing a USB connector.

FIG. 9 is a perspective view of a reinforcing member 134 which reinforces the above-described USB connector 44.

The reinforcing member 134 comprises a sheet metal member formed so as to cover an outer circumferential surface of the above-described USB connector 44 (that is, a top surface and both side surfaces of the pipe member 44A), and have attaching portions 134A and 134B which are to be attached to a hole portion 130A and protruding portions 130B (see FIG. 8) formed on the control board 130 as well as a spring portion 134C which is to be brought into contact with a rear surface of the liquid crystal monitor 68.

The above-described attaching portion 134A has a tapped hole portion which is to be tightened with a screw by way of the hole portion 130A of the control board 130, and the attaching portion 134B has an engaging portion which is to be inserted into a concave portion between the two protruding portions 130B and engaged with one of the protruding portions 130B.

Figure 10:
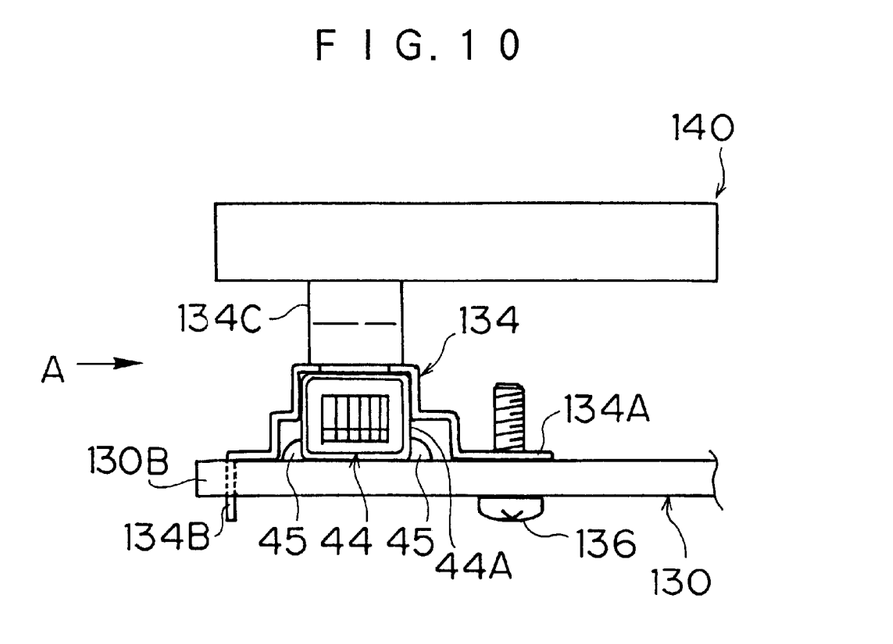
FIG. 10 is a side view showing a condition where the reinforcing member is attached to the control board.

FIG. 10 is a side view showing a condition where the above-described reinforcing member 134 is attached to the control board 130.

When the reinforcing member 134 having the above-described configuration is to be attached to the control board 130, an engaging portion of the attaching portion 134B of the reinforcing member 134 is first engaged with the protruding portion 130B of the control board 130 and then the attaching portion 134A of the reinforcing member 134 is tightened with a screw 136 from the rear side of the control board 130.

When the reinforcing member 134 is attached to the control board 130 as described above, the reinforcing member 134 is kept in contact with a top surface and both side surfaces of the pipe member 44A of the USB connector 44, thereby reinforcing attaching strength of the USB connector 44 to the control board 130. In addition, it is preferable to fix the reinforcing member 134 to the pipe member 44A of the USB connector 44 by soldering or the like. Though the attaching portions 134A and 134B of the reinforcing member 134 are configured to be fixed to the control board 130 by the screwing and the engagement respectively, this embodiment is not limitative, and the attaching portions may be fixed by only one or a combination of two or more of the screwing, engagement and soldering. A fixing method is not mattered so far as the reinforcing member can be fixed to the board.

Then, description will be made of a function of the spring portion 134C which is formed integrally with the reinforcing member 134.

In a condition where the power source board 120 and the control board 130 are fixed between the main frame 110 and the sub-frame 140 as described with reference to FIG. 7, the sub-frame 140 is disposed adjacent to the reinforcing member 134 of the control board 130.

Figure 11:
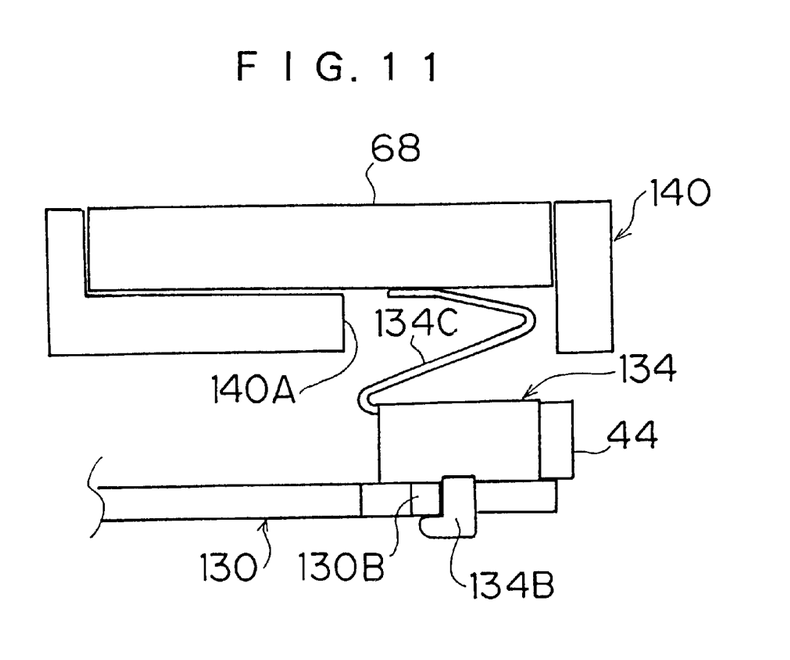
FIG. 11 is a side view of main members of the control board and the sub-frame as seen in a direction indicated by an arrow A in FIG. 10.

FIG. 11 is a side view showing main members of the control board 130 and the sub-frame 140 as seen in a direction indicated by an arrow A in FIG. 10.

As shown in FIGS. 11 and 4, an opening 140A is formed in the sub-frame 140 so as to face to a rear surface of the liquid crystal monitor 68 and the spring portion 134C of the reinforcing member 134 is kept in elastic contact with the rear surface of the liquid crystal monitor 68 through the opening 140A of the sub-frame 140.

Though a liquid crystal monitor which forms a main current has an outer circumference and a rear surface entirely covered with a metal member in order to obtain a shielding effect and the metal member is connected to a ground of an electronic camera, the electronic camera 10 does not allow the metal member to be connected to the ground via sub-frame 140 since the sub-frame 140 which holds the liquid crystal monitor 68 is made of resin.

Since the spring portion 134C of the above-described reinforcing member 134 is in the elastic contact with the rear surface of the liquid crystal monitor 68, the metal member on the rear surface of the liquid crystal monitor 68 can be connected to the ground of the control board 130. In addition, it is needless to say that the reinforcing member 134 is electrically connected to the ground of the control board 130 directly or by way of the pipe member 44A of the USB connector 44.

Accordingly, it is possible to dispose the USB connector 44 and the liquid crystal monitor 68 so as not to produce influence on each other due to noise. Furthermore, a pressing force is applied to the reinforcing member 134 from the liquid crystal monitor 68 by way of the spring portion 134C, serving as an aid to fix the reinforcing member 134.

The connector jack attaching structure according to the present invention is configured to cover an outer circumference of a connector jack disposed on a surface of a board with a reinforcing member and fix this reinforcing member to the board as described above, thereby being capable of reinforcing the connector jack and enhancing durability against insertion and extraction and prying of a plug. Furthermore, the connector jack attaching structure according to the present invention is capable of allowing the reinforcing member to prevent noise from penetrating into the connector jack.

Furthermore, the electronic camera according to the present invention adopts a resin molding for a frame for holding a liquid crystal monitor, thereby allowing the frame to have a more complicated form and a lighter weight than a metal frame. Furthermore, the electronic camera according to the present invention is capable of reducing noise since the electronic camera allows a metal member on a rear surface of the liquid crystal monitor held by the resin frame made of resin to be grounded easily by utilizing the reinforcing member.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A connector jack attaching structure for attaching a connector jack to a board, comprising:
    a reinforcing member shaped to cover an outer circumference of the connector jack and having an attaching portion to be attached to the board, comprising:
        a sheet metal member being connected to a ground; and
        an integrally formed spring portion which protrudes on a side opposite to the attaching portion;
    wherein the spring portion is kept in elastic contact with a member adjacent to the board, thereby grounding the member;
    wherein the connector jack is surface-mounted on the board;
    wherein the outer circumference of the connector jack surface-mounted on the board is covered with the reinforcing member;
    wherein the reinforcing member does not contact a bottom surface of the connector jack; and
    wherein the attaching portion of the reinforcing member is fixed to the board.

2. The connector jack attaching structure according to claim 1, wherein the attaching portion of the reinforcing member is fixed to the board by at least one of screwing, soldering and engagement.

3. An electronic camera, comprising:
    a connector jack attaching structure for attaching a connector jack to a board; and
    a liquid crystal monitor, wherein:
        the connector jack attaching structure comprises a reinforcing member shaped to cover an outer circumference of the connector jack and having an attaching portion to be attached to the board, said reinforcing member comprising:
            a sheet metal member being connected to a ground; and
            an integrally formed spring portion which protrudes on a side opposite to the attaching portion;
        the spring portion is kept in elastic contact with a member adjacent to the board, thereby grounding the member;
        the connector jack is surface-mounted on the board;
        the outer circumference of the connector jack surface-mounted on the board is covered with the reinforcing member;
        the attaching portion of the reinforcing member is fixed to the board;
        the liquid crystal monitor has a metal member on a rear surface thereof and is held with a frame of a resin molding; and
        the metal member on the rear surface of the liquid crystal monitor is brought into elastic contact with the spring portion of the reinforcing member when the frame is fixed in the camera, thereby grounding the metal member on the rear surface of the liquid crystal monitor through the reinforcing member.

4. An electronic camera, comprising:
    a connector jack attaching structure for attaching a connector jack to a board; and
    a liquid crystal monitor, wherein:
        the connector jack attaching structure comprises a reinforcing member shaped to cover an outer circumference of the connector jack and having an attaching portion to be attached to the board, said reinforcing member comprising:
            a sheet metal member being connected to a ground; and
            an integrally formed spring portion which protrudes on a side opposite to the attaching portion;
        the spring portion is kept in elastic contact with a member adjacent to the board, thereby grounding the member;
        the connector jack is surface-mounted on the board;
        the outer circumference of the connector jack surface-mounted on the board is covered with the reinforcing member;
        the attaching portion of the reinforcing member is fixed to the board by at least one of screwing, soldering and engagement;
        the liquid crystal monitor has a metal member on a rear surface thereof and is held with a frame of a resin molding; and
        the metal member on the rear surface of the liquid crystal monitor is brought into elastic contact with the spring portion of the reinforcing member when the frame is fixed in the camera, thereby grounding the metal member on the rear surface of the liquid crystal monitor through the reinforcing member.

5. A connector jack attaching structure for attaching a connector jack to a board, comprising:
a reinforcing member shaped to cover an outer circumference of the connector jack and having an attaching portion to be attached to the board, wherein:
the connector jack is surface-mounted on the board;
the outer circumference of the connector jack surface-mounted on the board is covered with the reinforcing member;
the attaching portion of the reinforcing member is fixed to the board;
the reinforcing member does not contact a bottom surface of the connector jack;
the connector jack has a rectangular pipe member into which an external connector is to be inserted;
a surface of the pipe member is disposed and surface-mounted on the board by soldering; and
the reinforcing member is kept in contact with three surfaces of the pipe member and shaped so as not to contact a soldering area to which the connector jack is soldered.

6. The connector jack attaching structure according to claim 5, wherein:
the reinforcing member has an integrally formed spring portion which protrudes on a side opposite to the attaching portion; and
the spring portion is kept in elastic contact with a member adjacent to the board, thereby grounding the member.

7. An electronic camera, comprising:
a connector jack attaching structure for attaching a connector jack to a board; and
a liquid crystal monitor, wherein:
the connector jack attaching structure comprises a reinforcing member shaped to cover an outer circumference of the connector jack and having an attaching portion to be attached to the board, said reinforcing member comprising:
a sheet metal member being connected to a ground; and
an integrally formed spring portion which protrudes on a side opposite to the attaching portion;
the spring portion is kept in elastic contact with a member adjacent to the board, thereby grounding the member;
the connector jack is surface-mounted on the board;
the outer circumference of the connector jack surface-mounted on the board is covered with the reinforcing member;
the attaching portion of the reinforcing member is fixed to the board; the connector jack has a rectangular pipe member into which an external connector is to be inserted;
a surface of the pipe member is disposed and surface-mounted on the board by soldering;
the reinforcing member is kept in contact with three surfaces of the pipe member;
the liquid crystal monitor has a metal member on a rear surface thereof and is held with a frame of a resin molding; and
the metal member on the rear surface of the liquid crystal monitor is brought into elastic contact with the spring portion of the reinforcing member when the frame is fixed in the camera, thereby grounding the metal member on the rear surface of the liquid crystal monitor through the reinforcing member.

8. The connector jack attaching structure according to claim 7, wherein the attaching portion of the reinforcing, member is fixed to the board by at least one of screwing, soldering and engagement.

9. An electronic camera, comprising:
a connector jack attaching structure for attaching a connector jack to a board; and
a liquid crystal monitor, wherein:
the connector jack attaching structure comprises a reinforcing member shaped to cover an outer circumference of the connector jack and having an attaching portion to be attached to the board, said reinforcing member comprising:
a sheet metal member being connected to a ground; and
an integrally formed spring portion which protrudes on a side opposite to the attaching portion;
the spring portion is kept in elastic contact with a member adjacent to the board, thereby grounding the member;
the connector jack is surface-mounted on the board;
the outer circumference of the connector jack surface-mounted on the board is covered with the reinforcing member;
the attaching portion of the reinforcing member is fixed to the board by at least one of screwing, soldering and engagement;
the liquid crystal monitor has a metal member on a rear surface thereof and is held with a frame of a resin molding; and
the metal member on the rear surface of the liquid crystal monitor is brought into elastic contact with the spring portion of the reinforcing member when the frame is fixed in the camera, thereby grounding the metal member on the rear surface of the liquid crystal monitor through the reinforcing member.

10. A connector jack attaching structure for attaching a connector jack to a board, comprising:
a reinforcing member shaped to cover an outer circumference of the connector jack and having an attaching portion to be attached to the board, comprising:
a sheet metal member being connected to a ground; and
an integrally formed spring portion which protrudes on a side opposite to the attaching portion;
wherein the spring portion is kept in elastic contact with a member adjacent to the board, thereby grounding the member;
wherein the connector jack is surface-mounted on the board;
wherein the outer circumference of the connector jack surface-mounted on the board is covered with the reinforcing member;
wherein the reinforcing member does not contact a bottom surface of the connector jack;
wherein the attaching portion of the reinforcing member is fixed to the board;
wherein the connector jack has a rectangular pipe member into which an external connector is to be inserted;
wherein a surface of the pipe member is disposed and surface-mounted on the board by soldering; and
wherein the reinforcing member is kept in contact with three surfaces of the pipe member and shaped so as not to contact a soldering area to which the connector jack is soldered.

* * * * *